United States Patent
Yamaji et al.

(10) Patent No.: US 8,866,296 B2
(45) Date of Patent: Oct. 21, 2014

(54) SEMICONDUCTOR DEVICE COMPRISING THIN-FILM TERMINAL WITH DEFORMED PORTION

(75) Inventors: Takashi Yamaji, Takamatsu (JP); Takaaki Kato, Takamatsu (JP)

(73) Assignee: AOI Electronics Co., Ltd., Takamatsu-shi (JP)

( * ) Notice: Subject to any disclaimer, the term of this patent is extended or adjusted under 35 U.S.C. 154(b) by 141 days.

(21) Appl. No.: 13/375,719

(22) PCT Filed: Jun. 24, 2009

(86) PCT No.: PCT/JP2009/061491
§ 371 (c)(1),
(2), (4) Date: Dec. 1, 2011

(87) PCT Pub. No.: WO2010/150365
PCT Pub. Date: Dec. 29, 2010

(65) Prior Publication Data
US 2012/0086133 A1  Apr. 12, 2012

(51) Int. Cl.
| | |
|---|---|
| H01L 23/495 | (2006.01) |
| H01L 21/56 | (2006.01) |
| H01L 23/00 | (2006.01) |
| H01L 21/683 | (2006.01) |
| H01L 23/31 | (2006.01) |

(52) U.S. Cl.
CPC ..... *H01L 21/568* (2013.01); *H01L 2924/01013* (2013.01); *H01L 2924/01006* (2013.01);
(Continued)

(58) Field of Classification Search
CPC .............. H01L 21/4825; H01L 21/67236; H01L 23/49541; H01L 23/49544; H01L 23/49551; H01L 23/49555

USPC .......... 257/692, 739, E23.043, E23.047, 257/E23.048
See application file for complete search history.

(56) References Cited

U.S. PATENT DOCUMENTS 7,049,683 B1 *  5/2006  Sirinorakul et al. .......... 257/666
2001/0033018 A1  10/2001  Kimura
(Continued)

FOREIGN PATENT DOCUMENTS

| CN | 101273452 A | 9/2008 |
| JP | 8-250641 A | 9/1996 |

(Continued)

OTHER PUBLICATIONS

International Search Report dated Aug. 11, 2009 (Two (2) pages).

*Primary Examiner* — Tom Thomas
*Assistant Examiner* — Christopher M Roland
(74) *Attorney, Agent, or Firm* — Crowell & Moring LLP

(57) ABSTRACT

A semiconductor device includes: a semiconductor chip with a plurality of electrode pads disposed at a top surface thereof; a plurality of thin film terminals set apart from one another via respective separator portions, which are located below a bottom surface of the semiconductor chip; an insulating layer disposed between the semiconductor chip and the thin-film terminals; connecting members that connect the electrode pads at the semiconductor chip with the thin-film terminals respectively and a resin layer disposed so as to cover the semiconductor chip, the plurality of thin-film terminals exposed at the semiconductor chip, the separator portions and the connecting members.

14 Claims, 26 Drawing Sheets

(52) U.S. Cl.
CPC . *H01L 23/49555* (2013.01); *H01L 2924/01004* (2013.01); *H01L 2224/83001* (2013.01); *H01L 2224/32227* (2013.01); *H01L 2224/32057* (2013.01); *H01L 2924/10158* (2013.01); *H01L 2924/01082* (2013.01); *H01L 2224/48235* (2013.01); *H01L 2224/838* (2013.01); *H01L 2224/2919* (2013.01); *H01L 2924/12041* (2013.01); *H01L 2224/32245* (2013.01); *H01L 2224/48095* (2013.01); *H01L 2224/83385* (2013.01); *H01L 2924/078* (2013.01); *H01L 2924/014* (2013.01); *H01L 24/48* (2013.01); *H01L 24/29* (2013.01); *H01L 24/32* (2013.01); *H01L 2224/97* (2013.01); *H01L 2924/01005* (2013.01); *H01L 21/6835* (2013.01); *H01L 2224/48471* (2013.01); *H01L 2924/01047* (2013.01); *H01L 2224/92247* (2013.01); *H01L 23/49551* (2013.01); *H01L 23/3107* (2013.01); *H01L 2924/01014* (2013.01); *H01L 2224/48247* (2013.01); *H01L 2924/01078* (2013.01); *H01L 2224/73265* (2013.01); *H01L 2924/0665* (2013.01); *H01L 24/83* (2013.01); *H01L 2221/68345* (2013.01); *H01L 2924/14* (2013.01); *H01L 2224/85001* (2013.01); *H01L 2224/48091* (2013.01); *H01L 2924/01033* (2013.01); *H01L 24/97* (2013.01); *H01L 2224/48479* (2013.01); *H01L 23/49544* (2013.01)

USPC ............ 257/739; 257/E23.043; 257/E23.047; 257/E23.048

(56) References Cited

U.S. PATENT DOCUMENTS

| | | |
|---|---|---|
| 2002/0168796 A1 | 11/2002 | Shimanuki et al. |
| 2003/0092253 A1 | 5/2003 | Yamaguchi |
| 2003/0178723 A1* | 9/2003 | Ito et al. ............... 257/735 |
| 2004/0157366 A1* | 8/2004 | Kang ..................... 438/106 |
| 2005/0003586 A1 | 1/2005 | Shimanuki et al. |
| 2006/0008947 A1 | 1/2006 | Yamaguchi |
| 2007/0052070 A1 | 3/2007 | Islam et al. |
| 2008/0268578 A1 | 10/2008 | Shimanuki et al. |

FOREIGN PATENT DOCUMENTS

| | | |
|---|---|---|
| JP | 10-079448 A | 3/1998 |
| JP | 11-195673 A | 7/1999 |
| JP | 11-260950 A | 9/1999 |
| JP | 2001-24083 A | 1/2001 |
| JP | 03-181229 B2 | 7/2001 |
| JP | 3181229 B2 | 7/2001 |
| JP | 2003-31730 A | 1/2003 |
| JP | 2003-142509 A | 5/2003 |
| JP | 2006-196922 A | 7/2006 |

\* cited by examiner

FIG.26
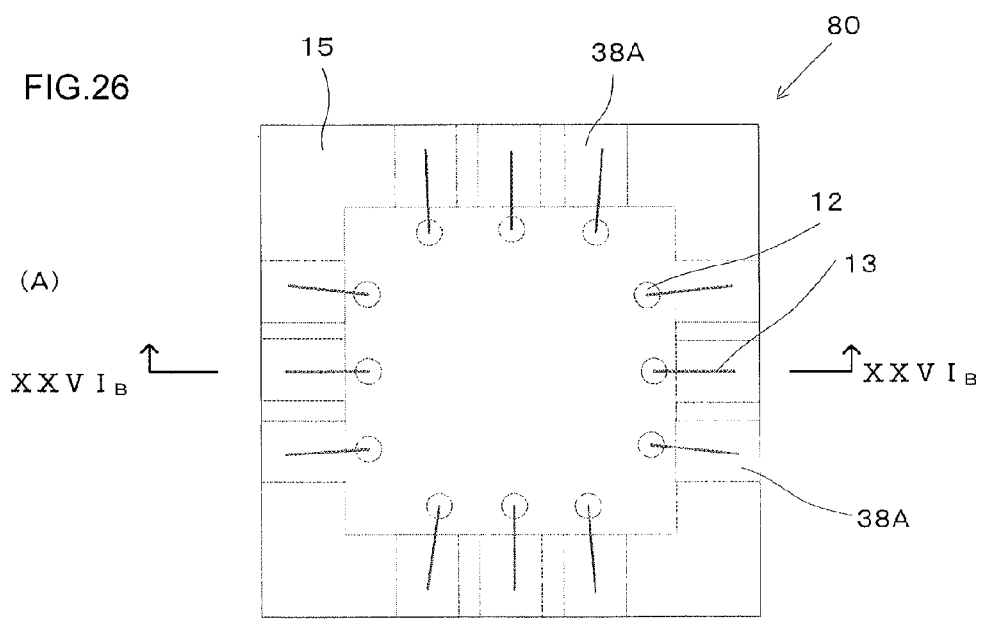
(A)
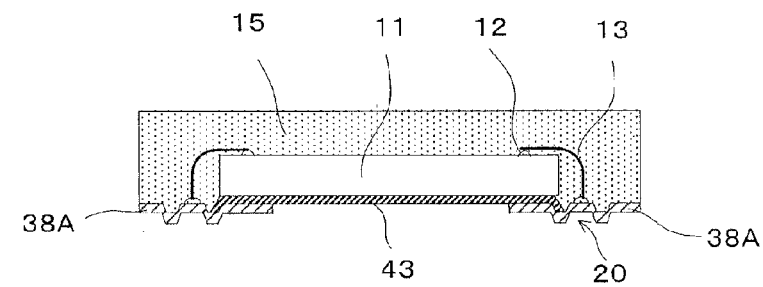
(B)
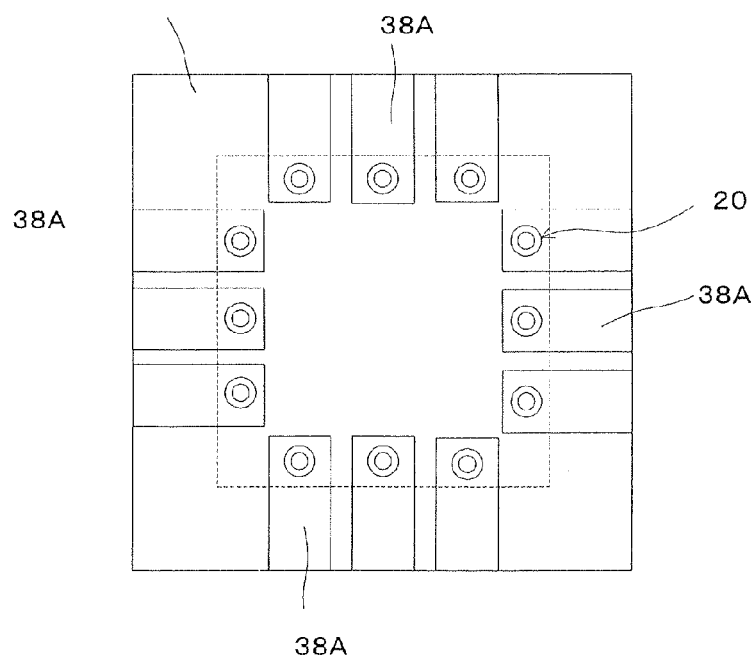
(C)

US 8,866,296 B2

SEMICONDUCTOR DEVICE COMPRISING THIN-FILM TERMINAL WITH DEFORMED PORTION

TECHNICAL FIELD

The present invention relates to a semiconductor device and a semiconductor device manufacturing method.

BACKGROUND ART

A semiconductor device in the known art may include a semiconductor chip packaged in a lead-frameless state. Such a semiconductor device is manufactured by forming dents at a lead frame in advance in a quantity corresponding to the number of electrode pads, forming a plating layer within the dents, wire-bonding the electrode pads and the plating layer, sealing the assembly in resin and then removing the lead frame (see, for instance, patent literature 1).

CITATION LIST

Patent Literature

Patent literature 1: Japanese Patent Gazette No. 3181229

SUMMARY OF INVENTION

Technical Problem

The method described above has less productivity, due to many manufacturing steps. In addition, since the number of electrode pads and their positions for a semiconductor chip change depending upon the functions, the type of usage and the size of the semiconductor chip. This necessitates a complicated design process through which an optimal quantity and positional arrangement for leads of a lead frame must be determined in correspondence to each semiconductor chip and the positions of dents where a plating layer is to be formed at the lead frames must also be determined, and then dents must be formed accordingly. As a result, the development of such a semiconductor device is time-consuming.

Solution to Problem

The semiconductor device according to the present invention comprises a semiconductor chip that includes a plurality of electrode pads located at a top surface thereof, a plurality of thin-film terminals set apart from one another via a separator portion, which are located below a bottom surface of the semiconductor chip, an insulating layer disposed between the semiconductor chip and each thin-film terminal, a connecting member that connects each of the electrode pads at the semiconductor chip with one of the thin-film terminals and a resin layer disposed so as to cover the semiconductor chip, the plurality of thin-film terminals exposed at the semiconductor chip, the separator portion and the connecting member.

In addition, a semiconductor device manufacturing method according to the present invention comprises a step of preparing a semiconductor chip that includes an electrode pad, a step of preparing a thin metal film with an area size larger than an area size of the semiconductor chip and fixing the semiconductor chip onto the thin metal film by electrically insulating the semiconductor chip from the thin metal film, a step of electrically connecting the electrode pad to the thin metal film via a connecting member, a step of forming an insulating layer upon the thin metal film so as to cover the semiconductor chip and the connecting member with the insulating layer and a step of forming the thin metal film into a thin-film terminal of a predetermined shape.

The present invention further provides a semiconductor device manufacturing method comprising a step of preparing a semiconductor chip that includes an electrode pad, a step of preparing a thin metal film with an area size larger than an area size of the semiconductor chip and fixing the semiconductor chip onto the thin metal film by electrically insulating the semiconductor chip from the thin metal film, a step of electrically connecting the electrode pad to the thin metal film via a connecting member, a step of forming an insulating layer upon the thin metal film so as to cover the semiconductor chip and the connecting member with the insulating layer, and a step of forming the thin metal film into a thin-film terminal of a predetermined shape, wherein each step is executed in this order.

Advantageous Effects of Invention

According to the present invention, thin-film terminals to be connected with electrode pads at a semiconductor chip can be formed without using a lead frame, and thus any need for lead frame processing is eliminated, making it possible to improve both the development time efficiency and the productivity.

BRIEF DESCRIPTION OF DRAWINGS

[FIG. 26] Illustrations of a semiconductor device achieved in a third embodiment of the present invention, with FIG. 26(A) showing the semiconductor device in a top view, FIG. 26(B) showing the semiconductor in a sectional view taken through $XXVI_B$-$XXVI_B$ in FIG. 26(A) and FIG. 26(C) showing the semiconductor device in a bottom view.

DESCRIPTION OF EMBODIMENTS (Embodiment 1)

The following is a description of a semiconductor device achieved in the first embodiment of the present invention.

Figure 1:
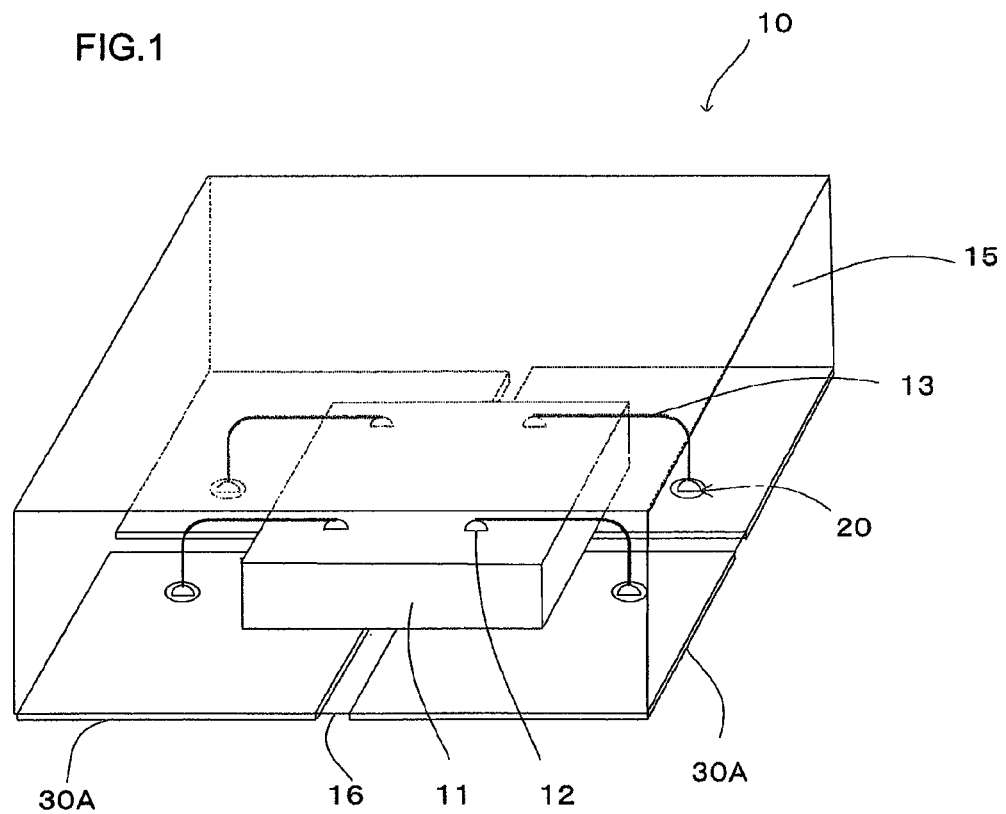
[FIG. 1] An enlarged perspective of a semiconductor device achieved in a first embodiment of the present invention.

FIG. 1 shows the semiconductor device according to the present invention in an enlarged perspective. A semiconductor device 10 includes a plurality of thin-film terminals 30A set apart from each other via a separator portion 16, which are located at the bottom surface of a semiconductor chip 11. The semiconductor chip 11 can be obtained by dicing a semiconductor wafer with integrated circuits formed thereat. The semiconductor chip 11 includes a plurality of electrode pads 12, surfaces of which are exposed. Although not shown, a protective film constituted with a silicon oxide film or a silicon oxide film with a polyimide film deposited thereupon, is formed around the electrode pads 12. While FIG. 1 shows electrode pads 12 formed as bumps, they do not need to project out beyond the top surface.

The thin-film terminals 30A each include an area ranging further out beyond the edges of the semiconductor chip 11. One end of a wire (connecting member) 13 is bonded to this area of each thin-film terminal 30A ranging out beyond the edges of the semiconductor chip 11. The other end of the wire 13 is bonded to an electrode pad 12. In other words, the thin-film terminals 30A are each electrically connected to the corresponding electrode pad 12 via the wire 13.

The semiconductor chip 11, the thin-film terminals 30A ranging out beyond the edges of the semiconductor chip 11, the separator portion 16 and the wires 13 are all covered with a thermosetting resin layer 15 such as an epoxy resin layer.

It is to be noted that while FIG. 1 shows a semiconductor device 10 with four electrode pads 12 and four thin-film terminals 30A included at the semiconductor chip 11 thereof for purposes of simplification, the actual semiconductor chip 11 will include numerous electrode pads 12, formed at the top surface thereof, and thin-film terminals 30A formed on the bottom side in a quantity corresponding to the number of electrode pads 20.

The thin-film terminals 30A are formed by using a metal foil such as an aluminum foil. While no specific limitations are imposed with regard to the thickness of the thin-film terminals, they are formed to assume a very small thickness of, for instance, 30 to 100 μm.

Figure 15:
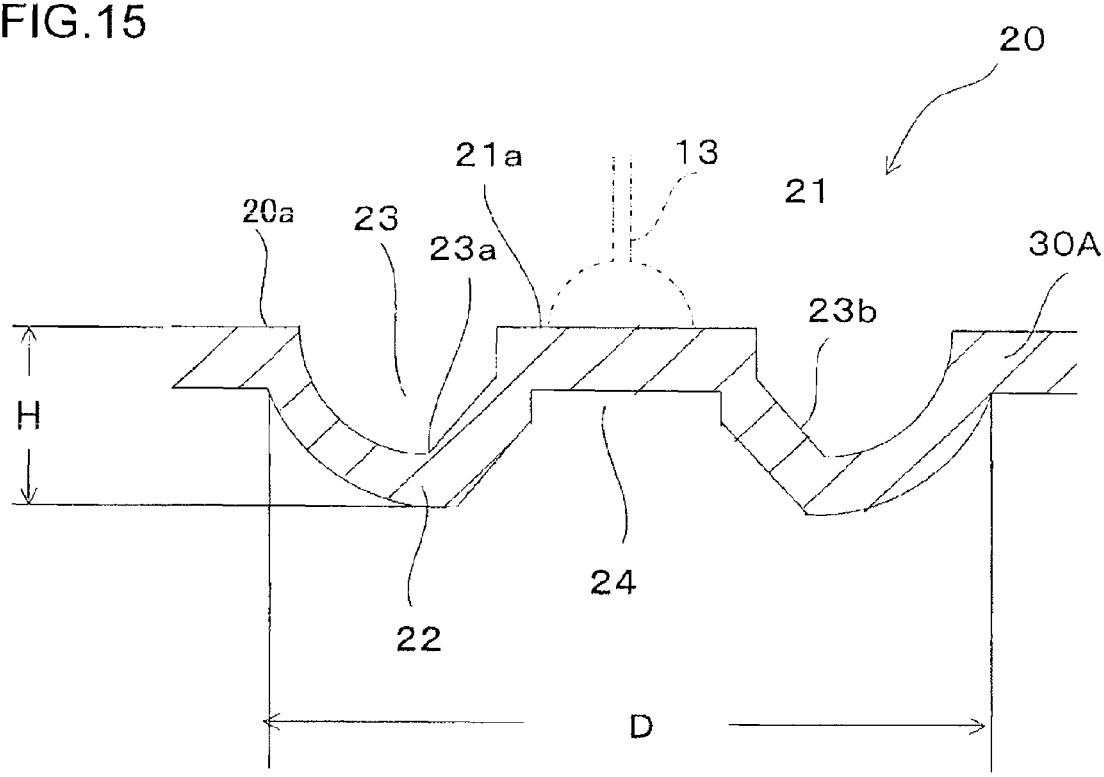
[FIG. 15] An enlarged sectional view showing a deformed portion of the thin metal film in detail.

The thin-film terminals 30A each include a deformed portion 20. FIG. 15 shows the deformed portion 20 in an enlarged sectional view.

The deformed portion 20 is made to project out from the side where the surface facing opposite the resin layer 15 is present toward the outer surface side (i.e., from the top surface side toward the bottom surface side in FIG. 15), with its outer contour substantially achieving a semispherical shape and includes a sunken area at the center thereof.

In more specific terms, a groove 23 that includes a deepest portion 23a, is formed inside a semispherical projecting portion 22, and an inclined portion 23b sloping upward in a straight line from the deepest portion 23a of the groove 23 toward the inner side is formed at the deformed portion 20.

A flat connecting portion 21, the plane of same level with a surface 20a surrounding the deformed portion 20, is formed at a top surface 21a located at the center of the deformed portion 20. The connecting portion 21 is supported by the inclined portion 23b of the groove 23. One end of the wire 13 is bonded at the top surface 21a of the connecting portion 21 as described earlier. The two-point chain line indicates how the wire 13 is bonded.

The connecting portion 21 and the inclined portion 23b of the groove 23 form a sunken area 24 achieving a circular cone shape viewed from the outside. As described later, a conductive connecting material used to establish a connection with an external terminal will be filled in the sunken area 24.

The resin layer 15 in FIG. 1 fills the grooves 23 at the deformed portions 20 so as to firmly hold the individual thin-film terminals 30A as the resin layer 15 sets, as explained later.

The semiconductor device 10 can be manufactured to achieve external dimensions of 2 to 5 mm (length)×2 to 5 mm (width)×0.3 to 0.8 mm (thickness). Such an extremely small semiconductor device 10 can be manufactured while assuring high production efficiency and high reliability.

The following is an example of a semiconductor device manufacturing method that may be adopted when manufacturing the semiconductor device achieved in the first embodiment.

FIGS. 2 through 8 show an example of a semiconductor device manufacturing method that may be adopted in the production of the semiconductor device according to the present invention in enlarged perspective views, whereas FIGS. 9 through 14 provide enlarged sectional views corresponding to FIGS. 2 through 7 respectively. It is to be noted, however, that while the FIGS. 2 through 8 illustrate a method for manufacturing numerous semiconductor devices simultaneously, FIGS. 9 through 14 show a single semiconductor device undergoing various manufacturing steps in sectional views for purposes of simplification.

Figure 2:
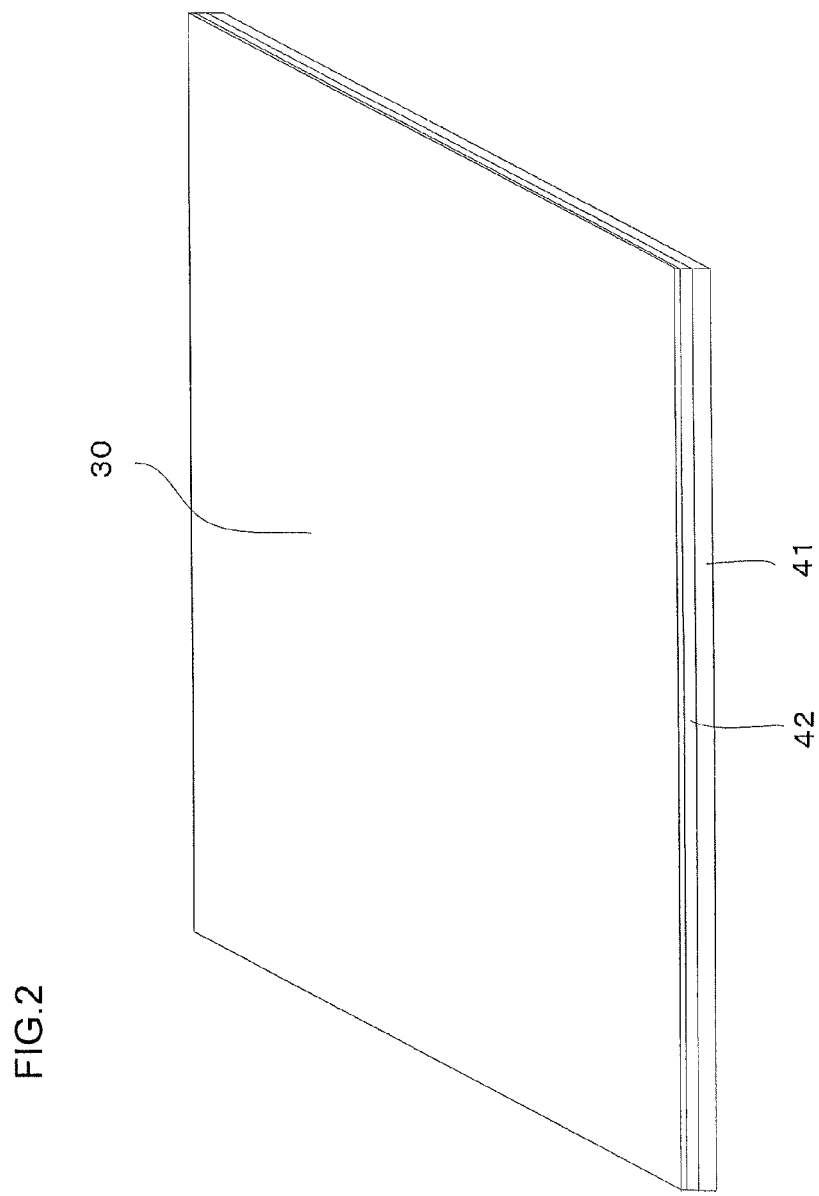
[FIG. 2] A perspective illustrating a semiconductor device manufacturing method that may be adopted when manufacturing the semiconductor device in FIG. 1.
Figure 3:
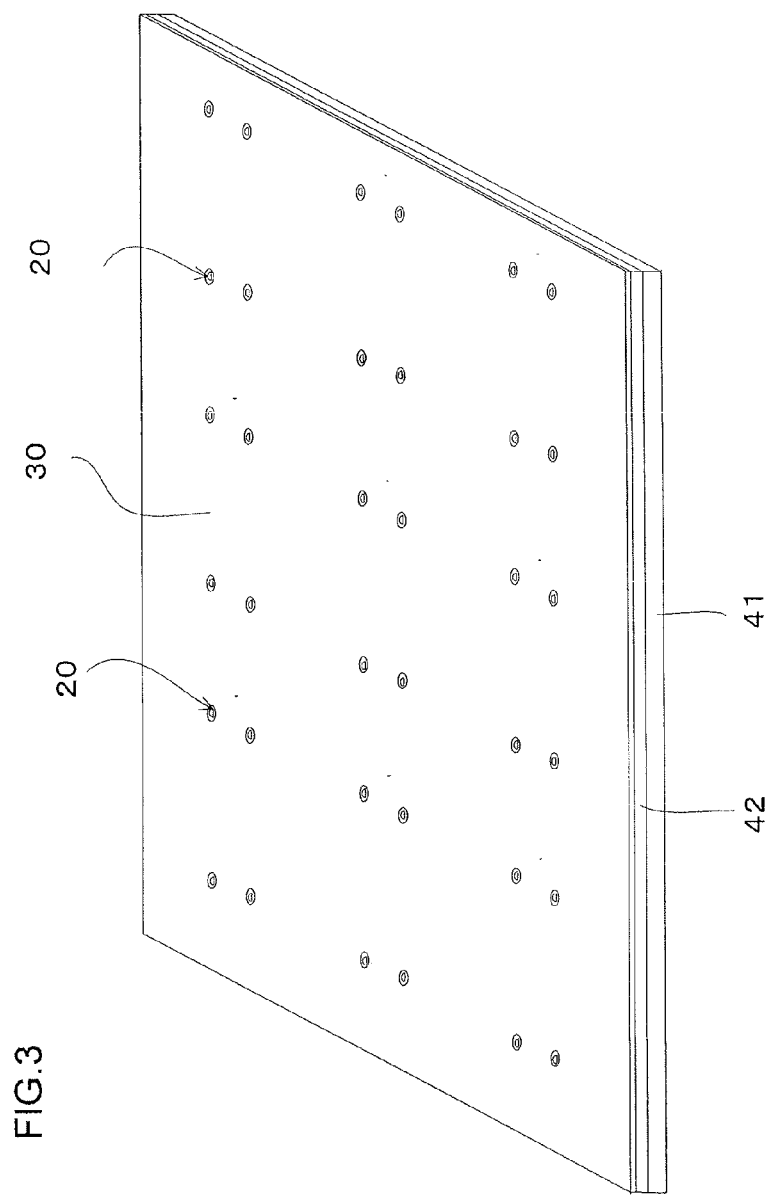
[FIG. 3] A perspective of a step following the step shown in FIG. 2.

First, a thin metal film 30 is prepared in a size that will accommodate formation of numerous semiconductor devices 10, the thin metal film 30 thus prepared is then bonded via an adhesive insulating layer 42 onto a base 41 assuming a matching size and constituted of stainless steel (SUS) or the like, as illustrated in FIG. 2.

Figure 9:
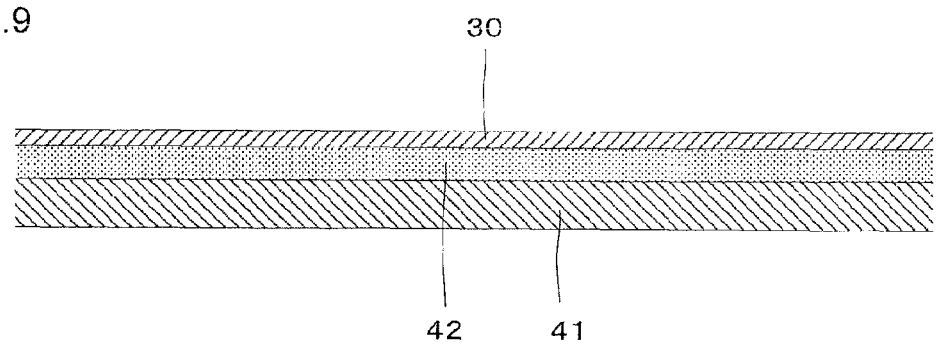
[FIG. 9] An enlarged sectional view of a single semiconductor device forming area during the step shown in FIG. 2 executed as part of the semiconductor device manufacturing method adopted when manufacturing the semiconductor device shown in FIG. 1.
Figure 10:
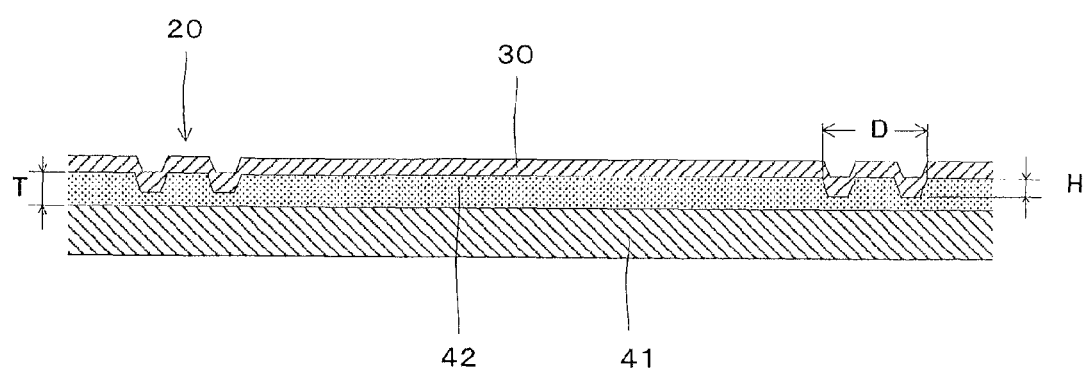
[FIG. 10] An enlarged sectional view of a step following the step shown in FIG. 9, which corresponds to the step shown in FIG. 3.
Figure 11:
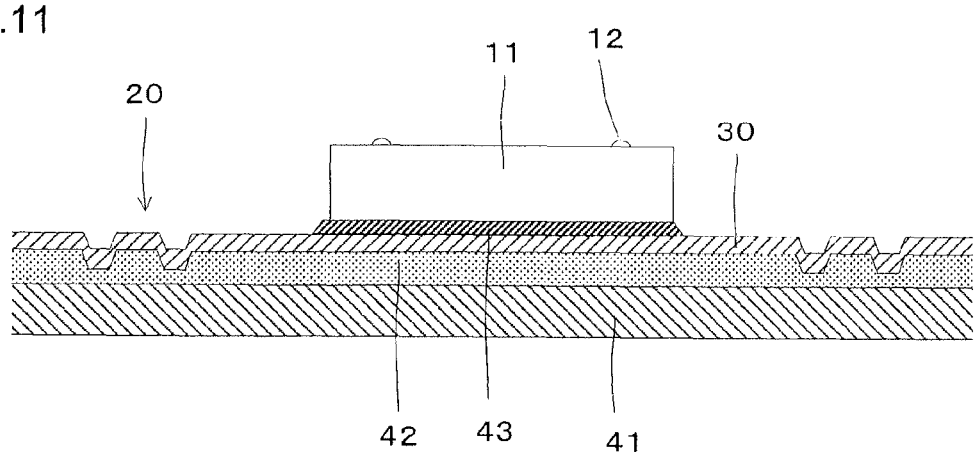
[FIG. 11] An enlarged sectional view of a step following the step shown in FIG. 10, which corresponds to the step shown in FIG. 4.

As shown in FIG. 9, the base 41, the insulating layer 42 and the thin metal film 30 are laminated in this order, one on top of another in tight contact.

Next, numerous deformed portions 20 are formed at the thin metal film 30 (see FIGS. 3 and 10) through press machining. As explained earlier, the deformed portions 20 achieve the sectional shape shown in FIG. 15, with the connecting portion 21 formed at the center of the projecting portion 22. The deformed portions 20 are formed by ensuring that they are completely contained within the insulating layer 42 in their entirety. Namely, the height H of the deformed portions 20 is smaller than the thickness T of the insulating layer 42.

For instance, the deformed portions 20 may be formed so as to achieve a height H of 30 to 70 μm and a diameter D of 200 to 300 μm, whereas the insulating layer 42 may be formed to achieve a thickness T of 50 to 200 μm. It is to be noted, however, that such values must be selected by ensuring that the requirement outlined above is satisfied, i.e., T>H.

Figure 4:
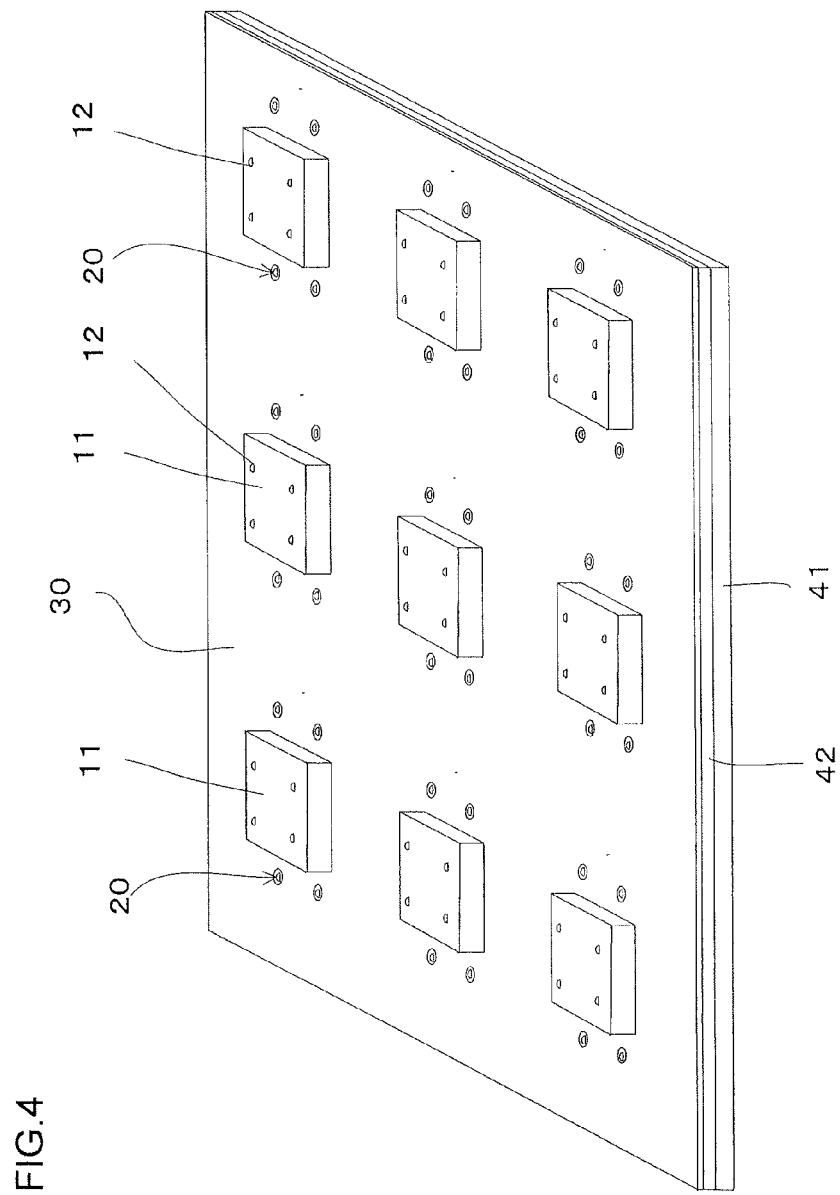
[FIG. 4] A perspective of a step following the step shown in FIG. 3.

Next, as shown in FIG. 4, semiconductor chips 11 with electrode pads 12 disposed at the top surfaces thereof are each firmly adhered to respective areas of semiconductor device to be formed on the thin metal film 30, as shown in FIG. 4. The semiconductor chips 11 are fixed onto the thin metal film 30 with an insulating member 43 constituted of, for instance, a die-attachment material, inserted between each semiconductor chip 11 and the thin metal film 30 (see FIG. 11). The insulating member may be bonded to the bottom surface of each semiconductor chip 11 in advance or may be bonded in advance onto the top surface of the thin metal film 30.

Figure 5:
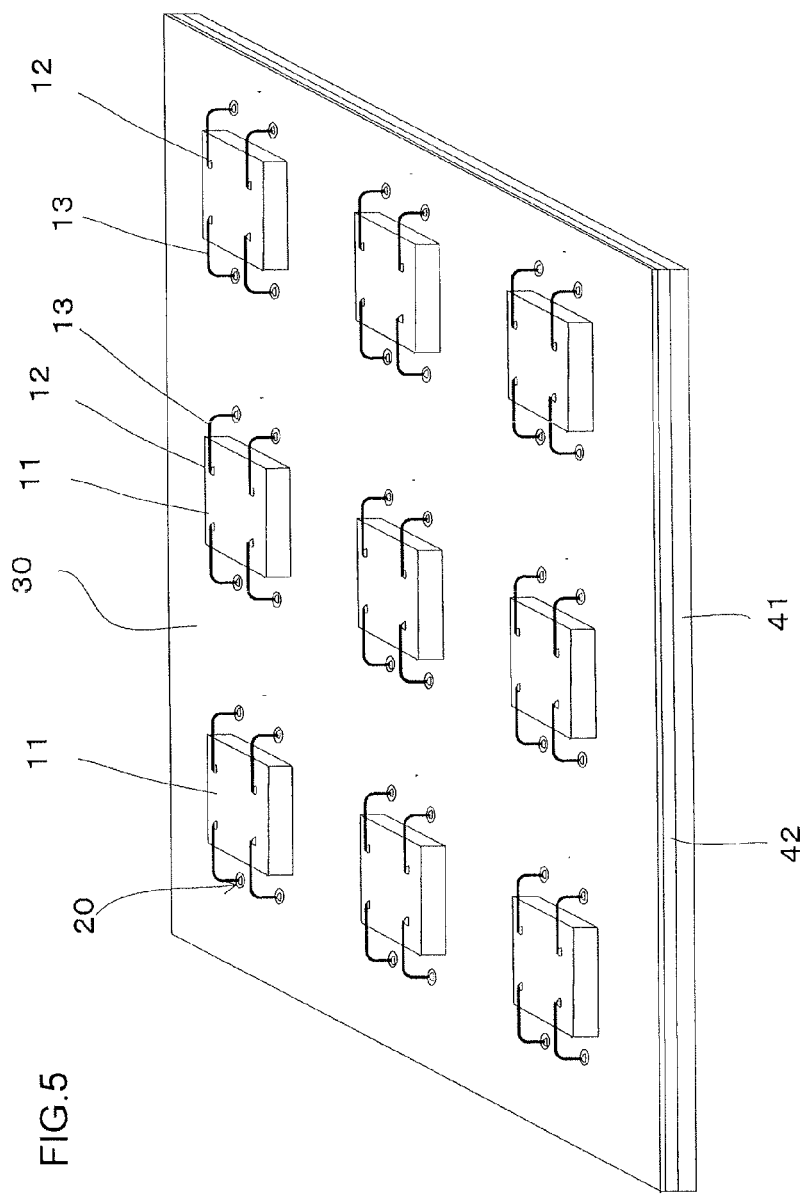
[FIG. 5] A perspective of a step following the step shown in FIG. 4.
Figure 12:
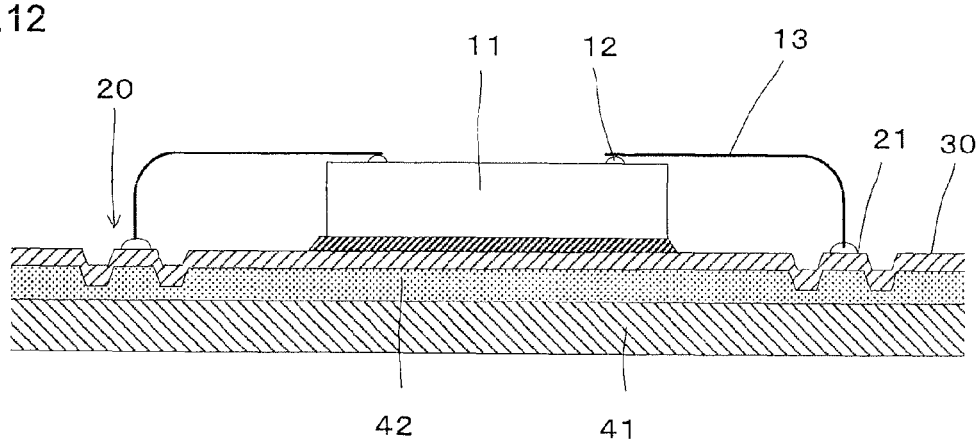
[FIG. 12] An enlarged sectional view of a step following the step shown in FIG. 11, which corresponds to the step shown in FIG. 5.

Next, the electrode pads 12 at the semiconductor chips 11 are bonded to the thin metal film 30 through wire bonding (see FIGS. 5 and 12).

Each wire is heated via a capillary (not shown) so as to form one end of the wire into the shape of a sphere, the spherical end of the wire is then bonded to the connecting portion 21 at a deformed portion 20 of the thin metal film 30, and the other end of the wire is bonded to an electrode pad 12. As a result, the electrode pad 12 becomes electrically connected to the thin metal film 30 via the wire 13.

As explained earlier, the connecting portion 21 at the deformed portion 20, to which the one end of the wire 13 is connected, is formed at any given position at the thin metal film 30. Therefore, there is no need to determine the size, the shape, the position and the like of the lead frame in advance through the design process in correspondence to the function, the purposes of use and the size of the semiconductor chip, which is in contrast to the method in the related art that the wire 13 is bonded at a predetermined position of a lead frame. Namely, the thin metal film 30 in this state is yet to be formed into terminals independent of one another as will be explained later and thus, the wires 13 can be bonded to the individual deformed portions 20 formed at optimal positions. Thus, the wire 13 assuming the optimal size can be bonded at the optimal position at the thin metal film 30 according to the present invention.

Figure 6:
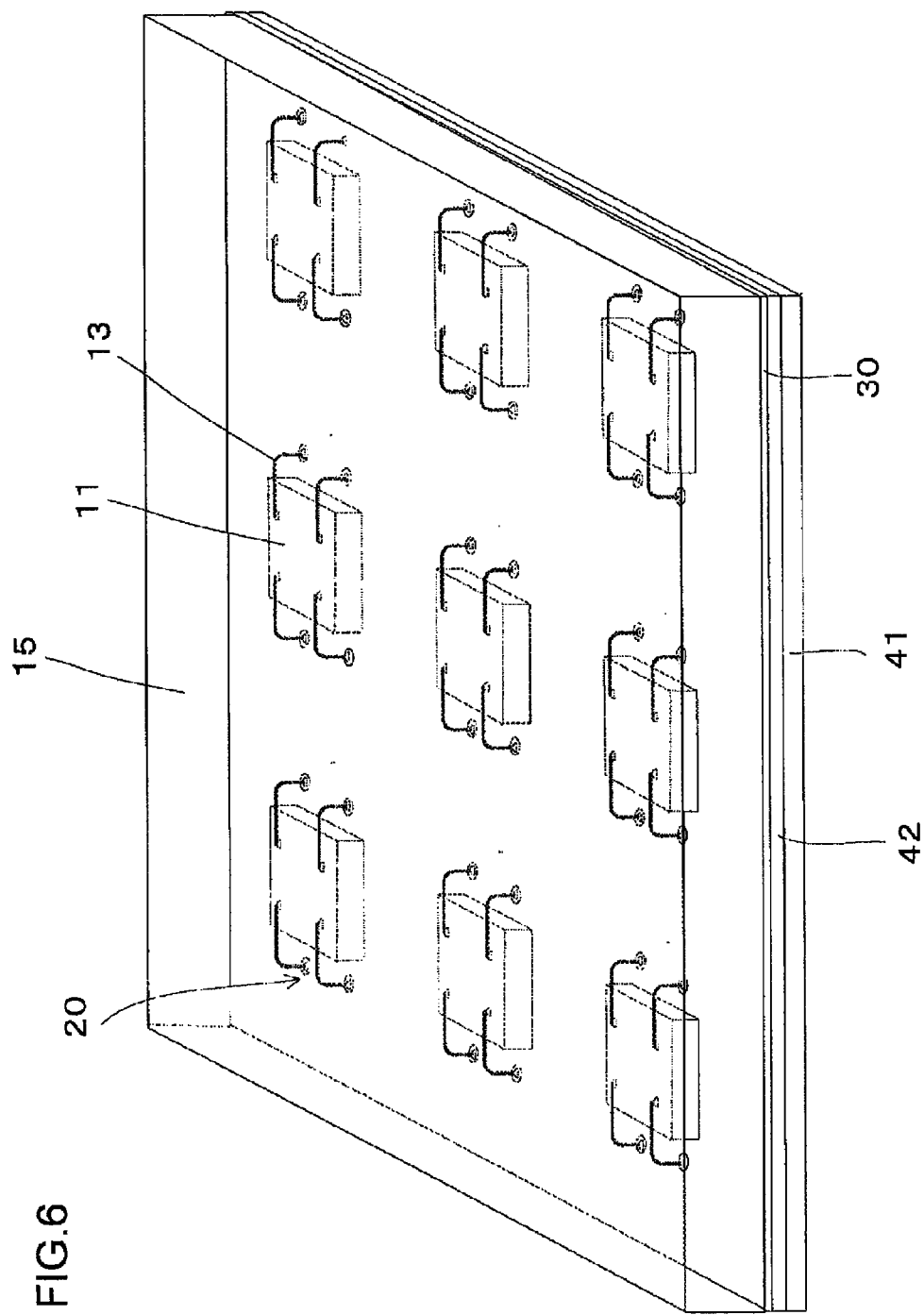
[FIG. 6] A perspective of a step following the step shown in FIG. 5.
Figure 13:
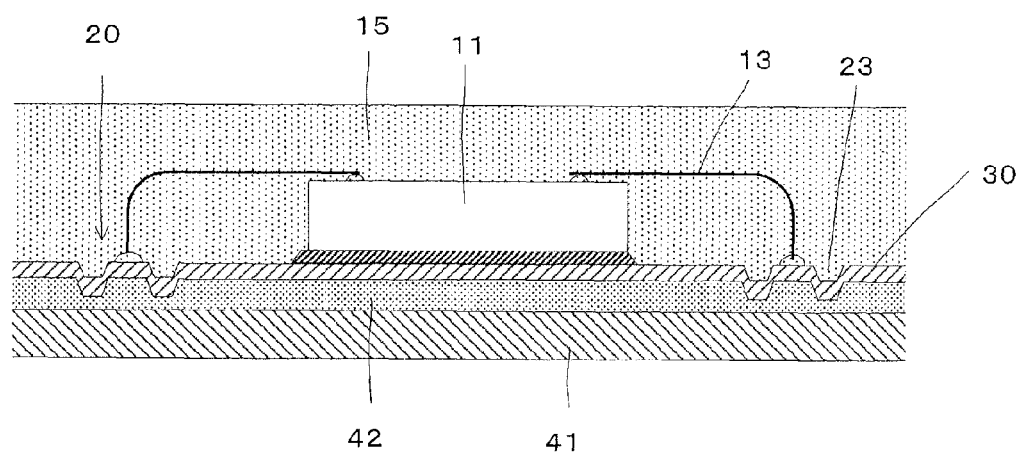
[FIG. 13] An enlarged sectional view of a step following the step shown in FIG. 12, which corresponds to the step shown in FIG. 6.

Next, while sustaining the condition shown in FIGS. 5 and 12, the assembly is set inside a die (not shown), a resin is poured into the die so as to cover the entire area over the thin metal film 30 with the resin layer 15. In other words, the resin layer 15 is formed all over the top surface and all the side surfaces of the semiconductor chip 11, over the top surface of the thin metal film 30 where it is not covered by the semiconductor chips 11 and over the wires 13, as shown in FIGS. 6 and 13.

In this state, the resin layer 5 also fills the grooves 23 formed at the deformed portions 20. The resin layer 15 then cools down. In the state illustrated in FIGS. 6 and 13, the thin metal film 30 is held only with the bonding strength with which the insulating layer 42 and the resin layer 15 are bonded to the thin metal film 30. However, as the resin layer 15, which also fills the grooves 23 at the deformed portions 20, cools down and thus shrinks, the bond between the thin metal film 30 and the resin layer 15 is reinforced according to the present invention.

Figure 7:
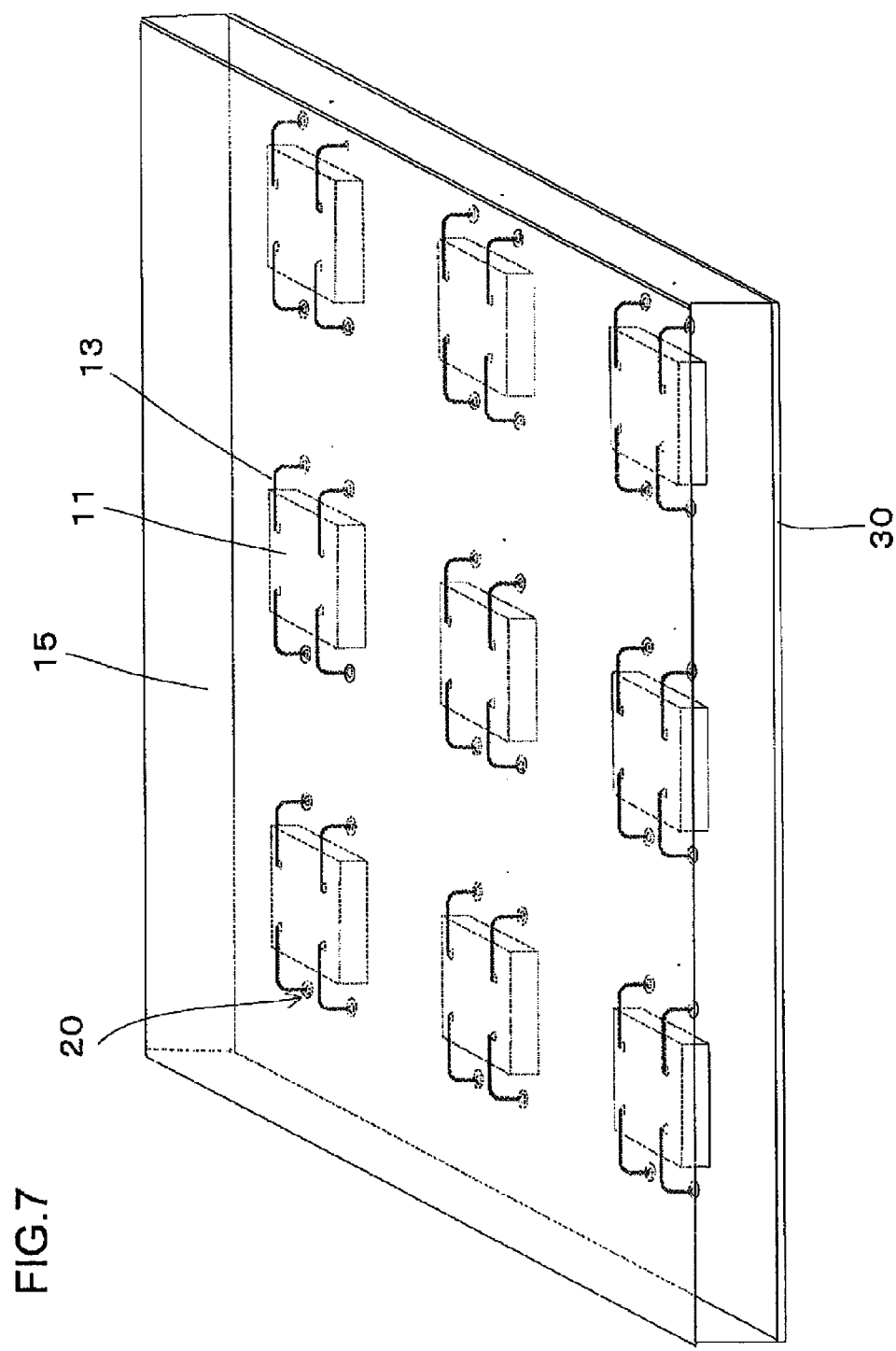
[FIG. 7] A perspective of a step following the step shown in FIG. 6.

Next, the bottom surface of the thin metal film 30 is exposed by removing the base 41 and the insulating layer 42 (see FIG. 7).

Figure 8:
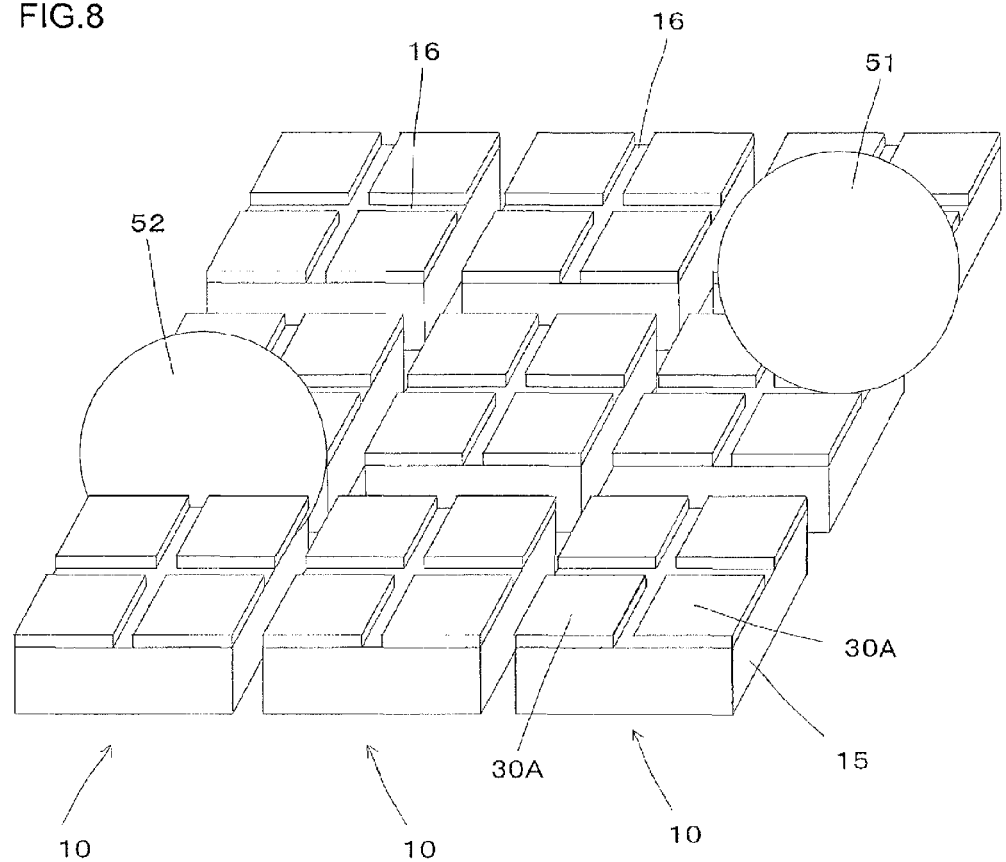
[FIG. 8] A perspective of a step following the step shown in FIG. 7, in a view taken from the back side surface by turning the front/rear sides shown in FIGS. 2 through 7.

Then, as shown in FIG. 8, a dicing blade 51 is applied to cut into the thin metal film 30 located on the bottom side of the semiconductor chips 11 so as to create separate portions set apart from one another by the separator portion 16 both along the lateral direction and the longitudinal direction, as shown in FIG. 8.

Figure 14:
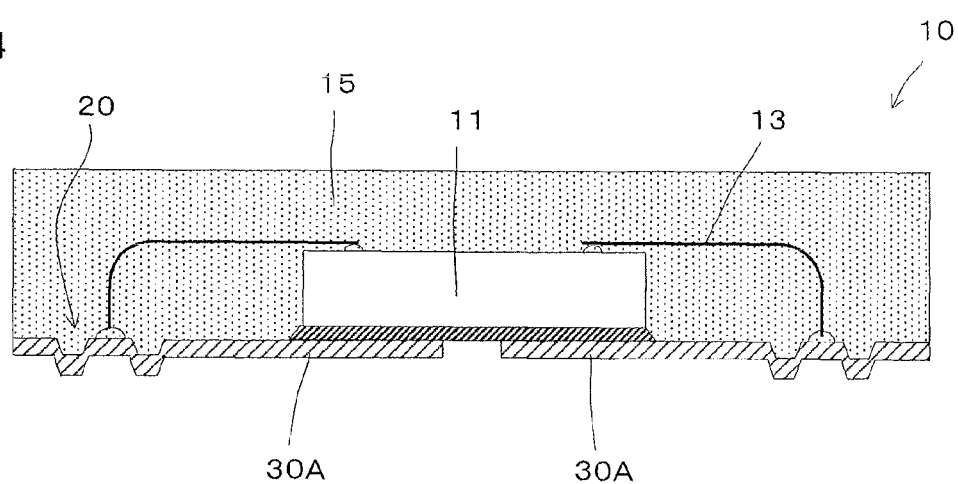
[FIG. 14] An enlarged sectional view of a step following the step shown in FIG. 13, which corresponds to the step shown in FIG. 7.

Next, as a dicing blade 52 cuts through the thin metal film 30 and the resin layer 15 at boundaries of the individual semiconductor device forming areas along the lateral and longitudinal directions, thin-film terminals 30A are formed with portions of the thin metal film 30 having become separated from one another, and as a result, semiconductor devices 10 according to the present invention, such as that shown in FIGS. 1 and 14, are manufactured.

If the bonding strength with which the thin metal film 30 and the resin layer 15 are bonded to each other is not sufficient, the thin metal film 30 may become separated from the resin layer as the dicing blade 52 cuts through the thin metal film 30 and the resin layer 15, hindering the formation of the thin-film terminals 30A. However, according to the present invention, deformed portions 20 are formed at the thin metal film 30 and thus, as the resin layer 15 filling the deformed portions 20 shrinks, the resin layer 15 becomes pressed against the projecting portions 22 of the deformed portions 20, resulting in an increase in the bonding strength with which the thin metal film 30 and the resin layer 15 are bonded to each other and making it possible to prevent separation of the thin-film terminals 30.

The separator portions 16 may be formed by cutting into the thin metal film 30 and the resin layer 15 at the boundaries of the individual semiconductor device forming areas without dicing blades. For instance, the cutting process may be executed through wet-etching by using an etching solution or through a dry-etching method such as plasma etching executed in conjunction with a chemically reactive gas and/or an inert gas.

As described above, the semiconductor device and the semiconductor device manufacturing method according to the present invention enable formation of a thin-film terminal to be connected to an electrode pad at a semiconductor chip without requiring the use of a lead frame. This means that the need for lead frame processing is eliminated, leading to an improvement in development time efficiency and productivity. In particular, since a pattern mask, which would otherwise be required for forming a lead frame, is not needed, the manufacturing cost can be greatly reduced. In addition, since a wire can be bonded at any position assumed on the thin metal film 30 with external dimensions greater than those of the semiconductor chip 11, the bonding density can be increased by optimizing the positions and the sizes of the wire and the thin-film terminal.

Furthermore, since the thin-film terminal can be formed to achieve a very small thickness, a semiconductor device with an even lower profile can be manufactured while further reducing the manufacturing cost.

Moreover, the presence of the deformed portion 20, which includes the groove 23, at each thin-film terminal 30A assures an improvement in the bonding strength with which the thin-film terminal 30A and the resin layer 15 are bonded to each other.

Figure 16:
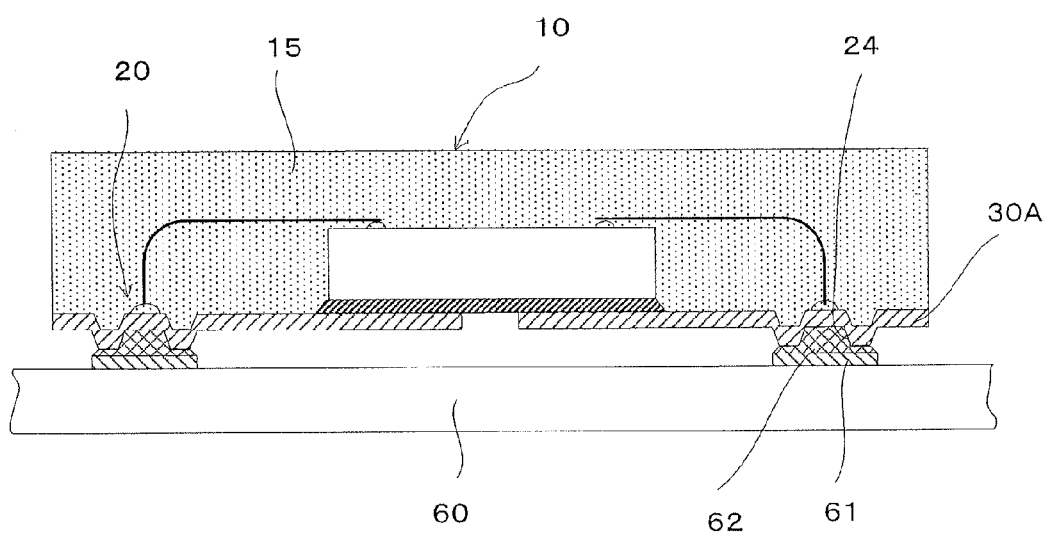
[FIG. 16] An enlarged sectional view of the semiconductor device according to the present invention mounted on a circuit board.

FIG. 16 shows the semiconductor device 10 according to the present invention mounted at a circuit board 60 in an enlarged sectional view.

Connector terminals 61 are formed at the top surface of the circuit board 60. The thin-film terminals 30A of the semiconductor device 10 are aligned with the connector terminals 61 and the thin-film terminals 30A are each bonded to the corresponding connector terminal 61 via a bonding member 62 such as solder.

The sunken area 24 formed at the center of the deformed portion 20 and the bonding member 62 improves the bonding strength by filling the sunken area 24. The bonding member 62 may be disposed upon the connector terminal 61 or it may be disposed over the surface of the projecting portion 22 and inside the sunken area at the deformed portion 20.

In addition, the bonding member 62 does not need to be constituted with solder and instead, a conductive connecting material such as silver paste or an anisotropic conductive connecting material having an insulating property along the planar direction and being electrically conductive only in the thickness direction, may be used as the bonding member 62.

(Embodiment 2)

In the first embodiment, the deformed portion 20 is formed only where each thin-film terminal 30A at the semiconductor device 10 is connected to a wire 13. However, numerous deformed portions 20 may be formed at each thin-film terminal 30A, instead.

Figure 21:
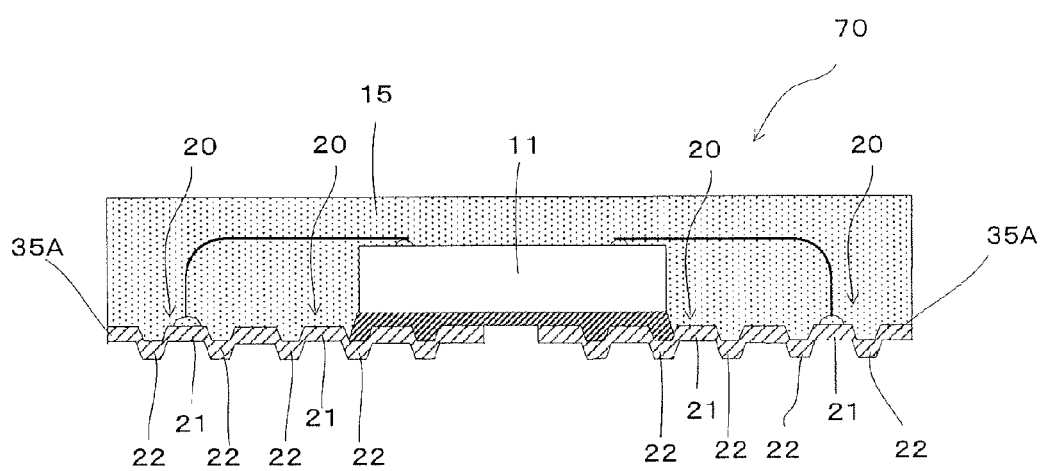
[FIG. 21] An enlarged sectional view of a step following the step shown in FIG. 20.

FIG. 21 is an enlarged sectional view of such a semiconductor device 70. The semiconductor device 70 includes thin-film terminals 35A at each of which numerous deformed portions 20 are formed. The deformed portions 20, each adopting the structure described in reference to the first embodiment, are formed so that projecting portions 22 and connecting portions 21 are set in an alternating pattern along the longitudinal direction. One end of a wire 13, with the other end thereof connected to an electrode pad 12, is connected to one of the plurality of deformed portions 20. Numerous deformed portions 20 are also formed along a direction perpendicular to the drawing sheet, as in a plurality of lines.

The following is a description of an example of a manufacturing method that may be adopted when manufacturing the semiconductor device shown in FIG. 21, given in reference to FIGS. 17 through 21.

It is to be noted that the second embodiment will be described by assigning the same reference numerals to members identical to those in the first embodiment so as to simplify the explanation.

Figure 17:
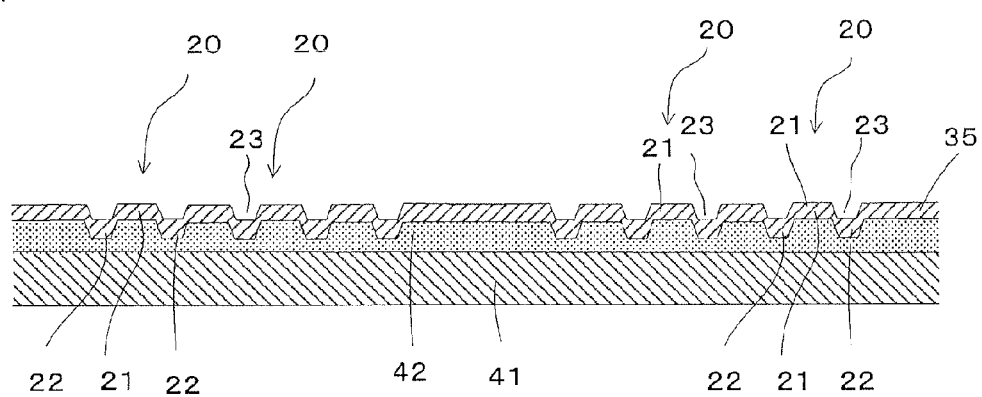
[FIG. 17] An enlarged sectional view of a semiconductor device and the semiconductor device manufacturing method adopted when manufacturing the semiconductor device, achieved in a second embodiment of the present invention.

At a thin metal film 35, bonded onto a base 41 via an insulating layer 42, as in the first embodiment, numerous deformed portions 20 are formed with a hot press. The second embodiment differs from the first embodiment in that numerous deformed portions 20 are formed along the longitudinal direction of the thin metal film 35 through this process. Namely, the connecting portions 21 each having a flat top surface and the projecting portions 22 are formed along the longitudinal direction of the thin metal film 35 in an alternating repetitive pattern, as illustrated in FIG. 17. A groove 23 is formed at the inner surface of the projecting portion 22 in each deformed portion 20, whereas a sunken area 24, assuming the shape of a circular truncated cone, is formed at the outer surface of the connecting portion 21 at each deformed portion 20. Although not shown, the deformed portions 20 are formed as in numerous lines along the depth direction the thin metal film 35 (along the direction perpendicular to the drawing sheet). It is desirable that the deformed portions 20 in each line be formed over uniform intervals so that equal numbers of deformed portions are formed at individual thin-film terminals, to achieve uniform bonding strength with which the thin metal film is bonded to the resin layer. However, it is not absolutely necessary to form deformed portions 20 over equal intervals and they may instead be formed over irregular intervals.

Figure 18:
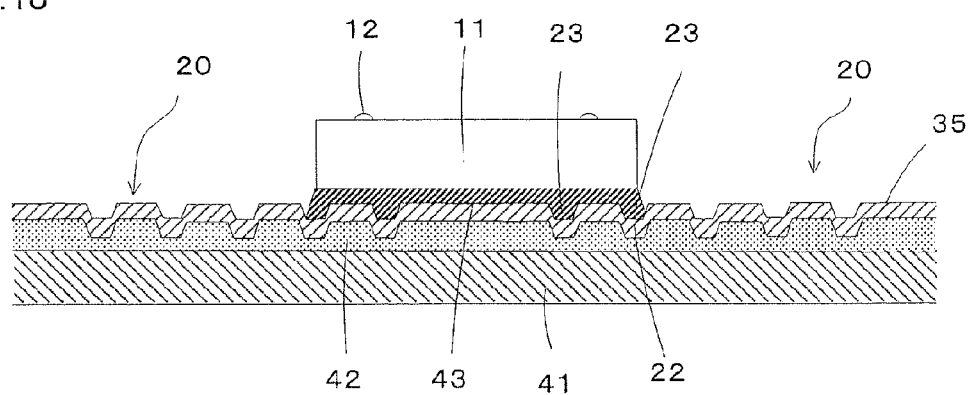
[FIG. 18] An enlarged sectional view of a step following the step shown in FIG. 17.

Next, a semiconductor chip 11 that includes electrode pads 12 is firmly adhered onto each semiconductor device forming area at the thin metal film 35. As in the first embodiment, the semiconductor chip 11 is fixed to the thin metal film 35 via an insulating member 43. However, unlike in the first embodiment, the insulating member 43 is formed so as to cover one deformed portion 20 among the deformed portions 20 at the thin metal film 35. Namely, the insulating member 45 is formed so as to fill the grooves 23 at some deformed portions 20, as shown in FIG. 18. This structure assures a stronger bond between the insulating member 43 and the thin metal film 35 than that achieved in the first embodiment.

Figure 19:
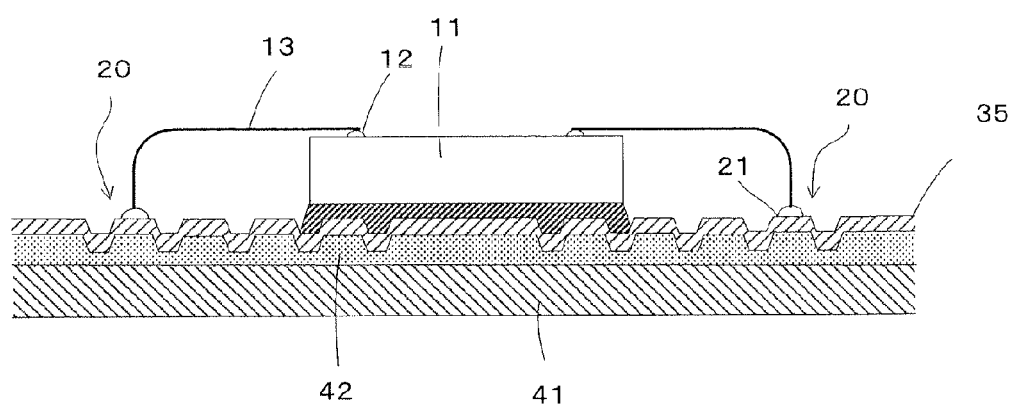
[FIG. 19] An enlarged sectional view of a step following the step shown in FIG. 18.

Next, the electrode pads 12 are each connected to one of the plurality of deformed portions 20 at the thin metal film 35 via a wire 13, as shown in FIG. 19. While numerous deformed portions 20 have been formed, each electrode pad should be connected to the connecting portion 21 of the deformed portion 20 present at the optimal position among the many deformed portions 20 at this time.

Figure 20:
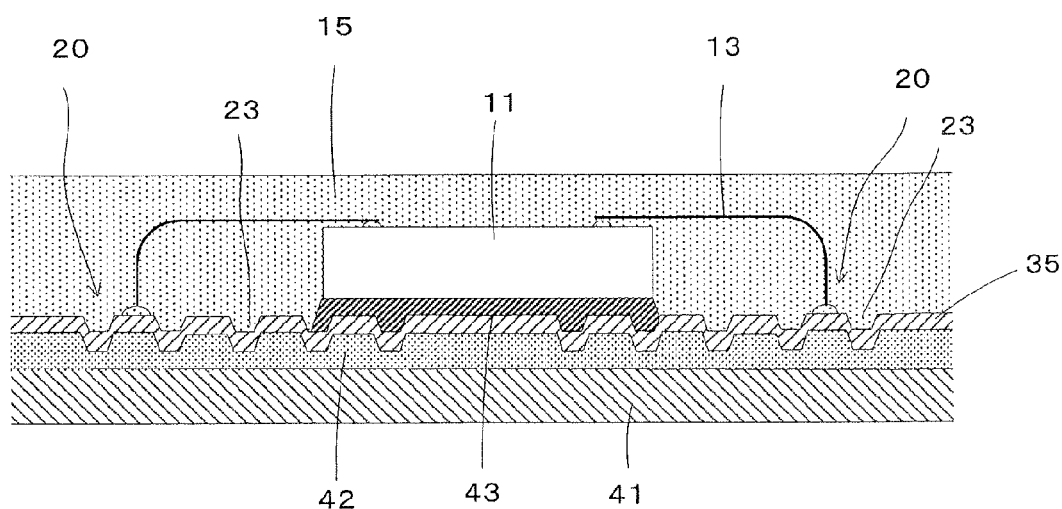
[FIG. 20] An enlarged sectional view of a step following the step shown in FIG. 19.

Next, the entire top surface of the thin metal film 35 is covered with a resin layer 15, as shown in FIG. 20. The resin layer 15 is formed so as to cover the upper surface, the side surfaces of a semiconductor chip 11, the thin metal film 35 where it is not covered by the semiconductor chip 11, and the surroundings of the wires 13. As a result, the grooves 23 at all the deformed portions 20 exposed outside the semiconductor chips 11 become filled with resin.

As has been described in reference to the first embodiment, the bond between the thin metal film 35 and the resin layer 15 is fortified with the presence of the resin layer 15 filling the grooves 23 at the deformed portions 20. Since the structure achieved in the second embodiment includes a greater number of deformed portions 20 formed therein compared to the first embodiment, an even stronger bond than that achieved in the first embodiment is established between the thin metal film 35 and the resin layer 15.

Next, the base 41 and the insulating layer 42 are removed so as to expose the bottom surface of the thin metal film 35.

Subsequently, the part of the thin metal film 35 located at the bottom center of each semiconductor chip 11 is removed through an optimal method such as dicing, as shown in FIG. 21. Then, the resin layer 15 and the thin metal film 35 are cut through at the boundaries of the individual semiconductor device forming areas, so as to obtain semiconductor devices 70 each equipped with thin-film terminals 35A separated from one another.

Advantages similar to those of the semiconductor device 10 in the first embodiment are achieved with the semiconductor device 70 in the second embodiment.

In addition, since the semiconductor device 70 in the second embodiment includes numerous deformed portions 20 formed at positions other than the connecting positions where the wires 13 are connected, the thin metal film 35 and the resin layer 15 can be fixed to each other with an even greater bonding strength.

(Variations)

The following is a description of variations of the semiconductor devices achieved in the first embodiment and the second embodiment.

Figure 22:
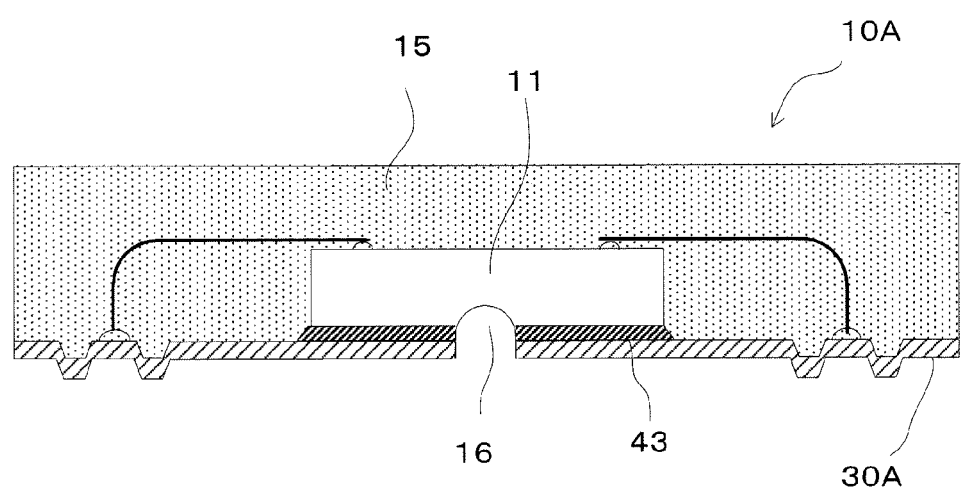
[FIG. 22] An enlarged sectional view of a semiconductor device achieved as a first variation of the semiconductor device according to the present invention.

FIG. 22 shows a semiconductor device 10A achieved as a variation of the semiconductor device 10. The semiconductor device 10A is distinguishable from the semiconductor device 10 in that a separator portion 16 in the semiconductor device 10A, passing through the thin film to separate thin-film terminals 30A from one another, also passes through the insulating member 43 to reach the bottom surface of the semiconductor chip 11.

This semiconductor device 10A can be manufactured by forming the thin-film terminals 30A by cutting through the thin metal film 30 with the dicing blade 51 with the cutting edge of the dicing blade 51 set at the position at which it reaches deep enough to partially cut through the bottom portion of the semiconductor chip 11 during the process illustrated in FIG. 8.

While FIG. 22 shows a variation of the semiconductor device 10, the separator portion 16 in the semiconductor device 70 shown in FIG. 21, too, may be formed deep enough to reach the bottom of the semiconductor chip 11.

Figure 23:
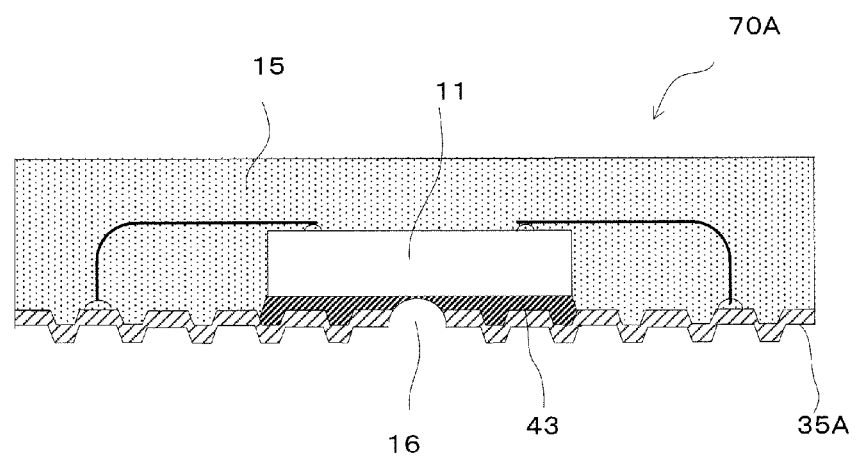
[FIG. 23] An enlarged sectional view of a semiconductor device achieved as a second variation of the semiconductor device according to the present invention.

FIG. 23 shows a variation 70A of the semiconductor device 70. The semiconductor device 70A is distinguishable from the semiconductor device 70 in that its separator portion 16 is formed so as to open up at least a bottom portion of the insulating member 43 as well as to separate thin-film terminals 35A from one another. This semiconductor device 70A can be manufactured by cutting through a thin metal film 35 with the dicing blade 51 so as to form the thin-film terminals 35A with the cutting edge of the dicing blade 51 set at a position at which it reaches the insulating member 43 but does not reach the semiconductor chip 11 during the process illustrated in FIG. 8.

While FIG. 23 shows a variation of the semiconductor device 70, the separator portion 16 in the semiconductor device 10, too, may assume a depth reaching the insulating member 43 without reaching the semiconductor chip 11.

Figure 24:
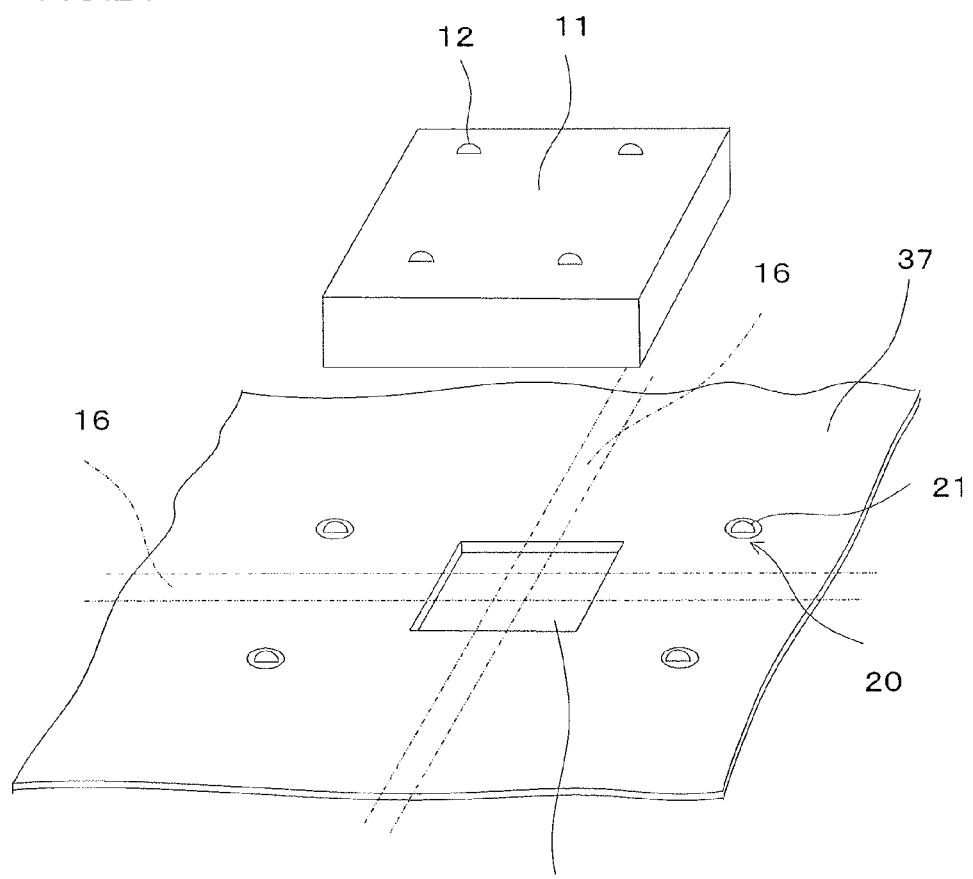
[FIG. 24] An enlarged perspective presenting another example of the semiconductor device manufacturing method according to the present invention.

FIG. 24 presents an example of a variation of the semiconductor device manufacturing method according to the present invention in an enlarged perspective.

The semiconductor devices achieved in the first and second embodiments are each manufactured by first connecting the thin metal film 30 or 35 to the electrode pads 12 at the semiconductor chip 11 via the wires 13 and then forming the thin-film terminals 30A or 35A by cutting through the thin metal film 30 or 35 with a dicing blade. In the alternative method shown in FIG. 24, a separator portion 16 is formed together with deformed portions 20 at a thin metal film 36, before mounting the semiconductor chip 11. The separator portion 16 includes part each assuming a length large enough to reach a point beyond the outer edges of the thin-film terminals being formed and extending along the lateral direction or the longitudinal direction by passing through the point marking the center of the semiconductor chip 11.

The semiconductor chip 11 is then fixed onto the thin metal film 36, the connecting portions 21 at the deformed portions 20 are connected to the electrode pads 12 via wires, the overall assembly is covered with the resin layer, and then the thin metal film 36 and the resin layer are cut through at positions indicated by the two-dot chain lines. As a result, the thin metal film 36 is formed into thin-film terminals 36A separated from one another. This method is advantageous in that the thin-film terminals 36A can be formed with better ease and reliability without subjecting the thin metal film 36 to any significant external force such as a shock.

Figure 25:
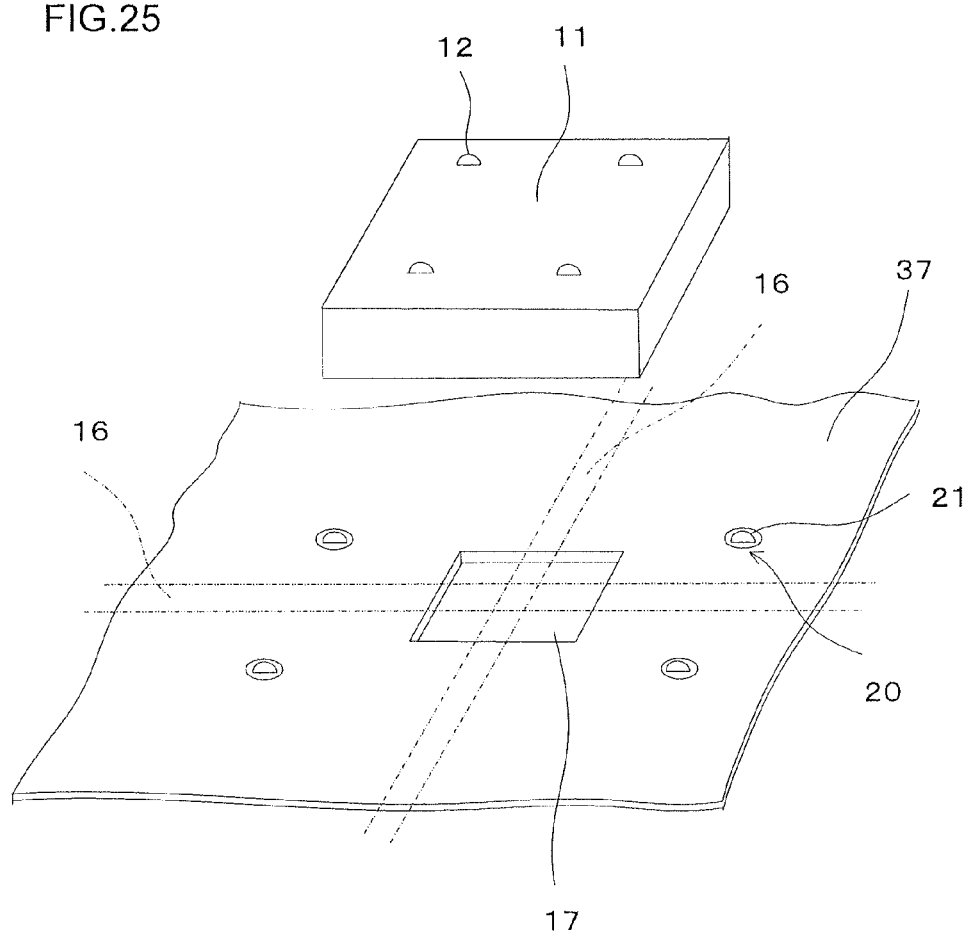
[FIG. 25] An enlarged perspective presenting yet another example of the semiconductor device manufacturing method according to the present invention, different from the example presented in FIG. 24.

FIG. 25 presents another example of a variation of the semiconductor device manufacturing method according to the present invention in an enlarged perspective.

In the example presented in FIG. 25, before mounting the semiconductor chip 11, an opening 17 with external dimensions smaller than the external dimensions of the semiconductor chip 11 is formed concurrently while forming the deformed portions 20, at a thin metal film 37 at a position corresponding to the center of the semiconductor chip 11.

The semiconductor chip 11 is then fixed onto the thin metal film 37, the connecting portions 21 at the deformed portions 20 are connected to the electrode pads 12 via wires, the overall assembly is covered with a resin layer, and then portions of the thin metal film 37, ranging through the opening 17, are removed along the lateral direction and the longitudinal direction as indicated by the two-dot chain lines, thereby forming a separator portion 16. As a result, the thin metal film 37 is formed into separate terminals.

Subsequently, the thin metal film 37 and the resin layer are cut through so as to achieve the intended semiconductor device external dimensions and individual semiconductor devices are thus manufactured.

(Embodiment 3)

FIG. 26 shows the semiconductor device achieved in the third embodiment of the present invention. A semiconductor device 80 achieved in the embodiment includes thin-film terminals formed along each side of the semiconductor chip 11 as illustrated in the top view presented in FIG. 26(A), in the sectional view presented in FIG. 26(B), which is taken through line $XXVI_B$-$XXVI_B$ in FIG. 26(A) and in the bottom view presented in FIG. 26(C).

The semiconductor chip 11 in the embodiment includes electrode pads 12 disposed along each of the four sides thereof. In addition, thin-film terminals 38A are formed side-by-side in a row in correspondence to each side of the semiconductor chips 11 where the electrode pads 12, which are to be connected with the thin-film terminals 38A, are present.

The thin-film terminals 38A, each fixed to the bottom surface of the semiconductor chip 11 via an insulating member 43, are each connected to an electrode pad 12 via a wire 13. In addition, the top side of the entire assembly, including the semiconductor chip 11 and the thin-film terminals 38A, is covered by a resin layer 15.

While three electrode pads 12 and three thin-film terminals 38A are disposed along each side of the semiconductor chip in the example presented in FIG. 26, the numbers of electrode pads 12 and thin-film terminals 38A to be disposed along each side can be increased to an extent equivalent to the limit of resolution of alignment and thin-film terminal formation, and no specific limitations are imposed with regard to the applicability of the present invention in relation to this issue.

It is to be noted that the strength of the bond between the resin layer 15 and the thin metal film 30 is improved with the resin layer 15 filling the grooves 23 formed at the deformed portions 20 formed at the thin metal film on the side facing opposite the resin layer 15 in the first through third embodiments. However, the bond between the resin layer 15 and the thin metal film 30 may be strengthened through a method other than that described above. For instance, minute asperity may be formed at the surface of the thin metal film 30 to face opposite the resin layer 15 so as to achieve a surface roughness of, for instance, approximately 6 to 10 μm. In addition, such minute asperity may be formed at the thin metal film 30 in combination with deformed portions 20, with grooves 23 formed therein, at the surface of the thin metal film 30 to face opposite the resin layer 15, as has been described in reference to the first through third embodiments.

Furthermore, the embodiments described above allow for the following variations.

While the description has been given on an example in which the present invention is adopted in a semiconductor chip that is an integrated circuit element that includes an integrated circuit. However, the present invention is not limited to this example and may be adopted for LED elements, passive elements used in network applications, discrete components or passive components used in semiconductor sensor applications or the like, or hybrid components.

While the connecting portions 21 of the deformed portions 20 are formed so that the plane of their top surfaces 21a lie in the same level with the top surfaces 20a of the thin-film terminals 30A, the present invention is not limited to this example and the top surfaces 21a of the connecting portions 21 may lie lower than the thin-film terminals 30A. In such a case, the top surfaces 21a of the connecting portions 21 may be set in the same level with the deepest portions 23a of the deformed portions 20.

In the embodiments described above, the resin layer 15 is formed by first bonding the semiconductor chips 11 to the thin metal film 30, and then forming the resin layer 15 through molding with the assembly placed, together with the base 41, inside a die. As an alternative, after the semiconductor chips 11 are bonded to the thin metal film 30, the base 41 may be removed before forming the resin layer 15. For instance, an upper die, with the top surface of the thin metal film 30 pressed along the outer edges thereof against the bottom surface of the upper die, and a lower die holding the bottom surface of the thin metal film 30 along the outer edges thereof may be clamped together and then, a resin may be poured into the die unit so as to form the resin layer 15.

The semiconductor device according to the present invention may assume any of various alternative structures without departing from the scope of the invention, as long as it comprises a semiconductor chip with a plurality of electrode pads disposed at a top surface thereof, a plurality of thin-film terminals set apart from one another via a separator portion, which are located at a bottom surface of the semiconductor chip, an insulating layer disposed between the semiconductor chip and the individual thin-film terminals, a connecting member that connects each of the electrode pads at the semiconductor chip with one of the thin-film terminals, and a resin layer disposed so as to cover the semiconductor chip, the plurality of thin-film terminals exposed at the semiconductor chip, the separator portion and the connecting member.

In addition, the semiconductor device manufacturing method according to the present invention simply needs to comprise at least: a step of preparing a semiconductor chip that includes an electrode pad, a step of preparing a thin metal film with an area size larger than an area taken up by the semiconductor chip and fixing the semiconductor chip onto the thin metal film by electrically insulating the semiconductor chip from the thin metal film, a step of electrically connecting the electrode pad to the thin metal film via a connecting member, a step of forming an insulating film over the thin metal film so as to cover the semiconductor chip and the connecting member with the insulating film, and a step of forming the thin metal film into a thin-film terminal achieving a predetermined shape.

REFERENCE SIGNS LIST 10, 10A semiconductor device
11 semiconductor chip
12 electrode pad
13 wire (connecting member)
15 resin layer
16 separator portion
17 opening
20 deformed portion
20a, 21a top surface
21 connecting portion
22 projecting portion
23 groove
23a deepest portion
24 sunken area
30, 35, 36, 37 thin metal film
30A, 35A, 36A, 38A thin-film terminal
31 top surface
41 base
42 insulating layer
43 insulating member
70, 70A, 80 semiconductor device

The invention claimed is:

1. A semiconductor device comprising:
a semiconductor chip with a plurality of electrode pads disposed at a top surface thereof;
a plurality of thin-film terminals set apart from one another via respective separator portions, which are located below a bottom surface of the semiconductor chip;
an insulating layer disposed between the semiconductor chip and the thin-film terminals;
connecting members that connect the electrode pads at the semiconductor chip with the thin-film terminals respectively; and
a resin layer disposed so as to cover the semiconductor chip, portions of the plurality of thin-film terminals that are not covered by the semiconductor chip, the separator portions and the connecting members, wherein
each of the plurality of thin-film terminals includes at least one deformed portion at a location where an end of one of the connecting members is connected to the each of the thin-film terminals;
the at least one deformed portion includes a semispherical projecting portion, a sunken portion, a connecting portion and a groove;
the semispherical projecting portion projects out from an inner side of the at least one deformed portion facing the resin layer toward an outer side of the at least one deformed portion opposite to the inner side;
the sunken potion is formed at the outer side of the at least one deformed portion and at a center of the semispherical projecting portion;
the connecting portion is formed at the inner side of the at least one deformed portion and at a center of the at least one deformed portion;
the groove is formed at the inner side of the at least one deformed portion inside the semispherical projecting portion;
the end of the one of the connecting members is connected at the connecting portion;
the connecting portion, the groove and a surrounding portion that surrounds the groove are electrically connected to each other within the each of the plurality of thin-film terminals;
a part of the resin layer fills the groove;

the sunken portion is provided for connecting each of the plurality of thin-film terminals to an external terminal via a bonding member filled in the sunken portion; and the semispherical projecting portion is connected to the sunken portion via a portion that is inclined in cross-section.

2. A semiconductor device according to claim 1, wherein:
the thin-film terminals each include minute asperity, which is more minute than the groove, formed at a surface thereof present on a side to come into contact with the resin layer.

3. A semiconductor device according to claim 1, wherein:
the connecting portion is formed integral with the each of the thin-film terminals, at a position shallower than a deepest portion of the at least one deformed portion.

4. A semiconductor device according to claim 1, wherein:
the each of the thin-film terminals includes an area that is laminated onto the bottom surface of the semiconductor chip and an area ranging further outside beyond the semiconductor chip, and the at least one deformed portion is formed in the area of the each of the thin-film terminals ranging further outside beyond the semiconductor chip.

5. A semiconductor device according to claim 1, wherein:
each of the plurality of thin-film terminals includes one or more deformed portions in addition to the at least one deformed portion.

6. A semiconductor device according to claim 1, wherein:
the thin-film terminals respectively assume a thickness in a 30 to 200 μm range.

7. A semiconductor device according to claim 1, wherein:
the sunken portion is formed at a position corresponding to the connecting portion.

8. A semiconductor device manufacturing method comprising:
a step of preparing a semiconductor chip that includes an electrode pad;
a step of preparing a thin metal film with an area size larger than an area size of the semiconductor chip and fixing the semiconductor chip onto the thin metal film via an insulating member;
a step of electrically connecting the electrode pad to the thin metal film via a connecting member;
a step of forming a resin layer over the thin metal film so as to cover the semiconductor chip and the connecting member with the resin layer; and
a step of forming the thin metal film into a thin-film terminal of a predetermined shape, wherein:
the step of preparing the thin metal film includes a step of forming a deformed portion at a location where an end of the connecting member is connected to the thin metal film, the deformed portion including a semispherical projecting portion, a sunken portion, a connecting portion and a groove;
the semispherical projecting portion projects out from an inner side of the deformed portion facing the resin layer toward an outer side of the deformed portion opposite to the inner side;
the sunken portion is formed at the outer side of the deformed portion and at a center of the semispherical projecting portion;
the connecting portion is formed at the inner side of the deformed portion and at a center of the deformed portion;
the groove is formed at the inner side of the deformed portion inside the semispherical projecting portion;

the connecting portion, the groove and a surrounding portion that surrounds the groove are electrically connected to each other within the thin-film terminal;
a part of the resin layer fills the groove;
the sunken portion is provided for connecting the thin-film terminal to an external terminal via a bonding member filled in the sunken portion; and
the semispherical projecting portion is connected to the sunken portion via a portion that is inclined in cross-section.

9. A semiconductor device manufacturing method according to claim 8, wherein:
the step of preparing the thin metal film includes a step of forming an opening over an area corresponding to the semiconductor chip.

10. A semiconductor device manufacturing method according to claim 9, wherein:
the opening includes a portion extending out to an area that does not correspond to the semiconductor chip.

11. A semiconductor device manufacturing method according to claim 8, wherein:
the step of preparing the thin metal film with the area size larger than the area size of the semiconductor chip includes a step of bonding the thin metal film onto a base via an insulating layer; and
the step of forming the deformed portion at the thin metal film includes a step of forming the deformed portion inside the insulating layer.

12. A semiconductor device manufacturing method according to claim 11, further comprising:
a step of removing the base executed after the step of forming the resin layer over the thin metal film so as to cover the semiconductor chip and the connecting member with the resin layer and before the step of forming the thin metal film into the thin-film terminal of a predetermined shape.

13. A semiconductor device manufacturing method according to claim 8, wherein:
the sunken portion is formed at a position corresponding to the connecting portion.

14. A semiconductor device manufacturing method comprising:
a step of preparing a semiconductor chip that includes an electrode pad;
a step of preparing a thin metal film with an area size larger than an area size of the semiconductor chip and fixing the semiconductor chip onto the thin metal film via an insulating member;
a step of electrically connecting the electrode pad to the thin metal film via a connecting member;
a step of forming a resin layer over the thin metal film so as to cover the semiconductor chip and the connecting member with the resin layer; and
a step of forming the thin metal film into a thin-film terminal achieving a predetermined shape, wherein:
each step is executed in this order;
the step of preparing the thin metal film includes a step of forming a deformed portion at a location where an end of the connecting member is connected to the thin metal film, the deformed portion including a semispherical projecting portion, a sunken portion, a connecting portion and a groove;
the semispherical projecting portion projects out from an inner side of the deformed portion facing the resin layer toward an outer side of the deformed portion opposite to the inner side;

the sunken portion is formed at the outer side of the deformed portion and at a center of the semispherical projecting portion;
the connecting portion is formed at the inner side of the deformed portion and at a center of the deformed portion;
the groove is formed at the inner side of the deformed portion inside the semispherical projecting portion;
the connecting portion, the groove and a surrounding portion that surrounds the groove are electrically connected to each other within the thin-film terminal;
a part of the resin layer fills the groove;
the sunken portion is provided for connecting the thin-film terminal to an external terminal via a bonding member filled in the sunken portion; and
the semispherical projecting portion is connected to the sunken portion via a portion that is inclined in cross-section.

* * * * *